United States Patent
Shiraiwa et al.

(10) Patent No.: US 8,023,246 B2
(45) Date of Patent: Sep. 20, 2011

(54) ELECTROSTATIC CHUCK AND METHOD OF MANUFACTURING THE SAME

(75) Inventors: Norio Shiraiwa, Nagano (JP); Takeshi Kobayashi, Nagano (JP); Yuichi Hata, Nagano (JP); Naoto Watanabe, Nagano (JP)

(73) Assignee: Shinko Electric Industries Co., Ltd., Nagano-shi, Nagano (JP)

( * ) Notice: Subject to any disclaimer, the term of this patent is extended or adjusted under 35 U.S.C. 154(b) by 614 days.

(21) Appl. No.: 12/116,631

(22) Filed: May 7, 2008

(65) Prior Publication Data

US 2008/0278883 A1    Nov. 13, 2008

(30) Foreign Application Priority Data

May 8, 2007   (JP) ................. 2007-123778

(51) Int. Cl.
*H01L 21/683* (2006.01)
*H01T 23/00* (2006.01)

(52) U.S. Cl. ...................................... 361/234

(58) Field of Classification Search ............. 361/234
See application file for complete search history.

(56) References Cited

U.S. PATENT DOCUMENTS

| | | | | |
|---|---|---|---|---|
| 5,745,331 A * | 4/1998 | Shamouilian et al. | ........ | 361/234 |
| 6,813,134 B2 | 11/2004 | Tatsumi et al. | | |
| 2001/0019765 A1 * | 9/2001 | Kiuchi et al. | ........ | 428/345 |

FOREIGN PATENT DOCUMENTS

| | | |
|---|---|---|
| JP | 63-283037 | 11/1988 |
| JP | 02-135753 | 5/1990 |
| JP | 2001-110883 | 4/2001 |
| JP | 2002-064134 | 2/2002 |
| JP | 2003-133400 | 5/2003 |
| JP | 2003-282690 | 10/2003 |
| JP | 2004-235563 | 8/2004 |
| JP | 2005-064105 | 3/2005 |
| WO | WO 2006/117871 | 11/2006 |

* cited by examiner

*Primary Examiner* — Rexford Barnie
*Assistant Examiner* — Christopher J Clark
(74) *Attorney, Agent, or Firm* — Drinker Biddle & Reath LLP

(57) ABSTRACT

In a method of manufacturing an electrostatic chuck, the method includes: a step of providing an electrostatic chucking portion including an electrode to which a voltage is applied and a film-like insulating layer covering the electrode; a step of bonding an elastomer layer onto the electrostatic chucking portion; a step of bonding a metal base onto the elastomer layer such that recess portions formed on a surface of the metal base face the elastomer layer.

10 Claims, 9 Drawing Sheets

ELECTROSTATIC CHUCK AND METHOD OF MANUFACTURING THE SAME

This application is based on and claims priority from Japanese Patent Application No. 2007-123778, filed on May 8, 2007, the entire contents of which are hereby incorporated by reference.

BACKGROUND OF THE INVENTION

1. Technical Field

The present disclosure relates to an electrostatic chuck having an elastomer layer and a method of manufacturing the same.

2. Background Art

In recent years, a size of the flat panel display (FPD) typified by the liquid crystal display device is increased, and the method and structure for stably-supporting a large-sized glass substrate becomes more and more important in the manufacturing steps of the FPD.

For example, the liquid crystal display device is manufactured in such a manner that two sheets of glass substrates on which color filters, a thin-film transistor array, etc. are provided are bonded together using a sealing material at an interval of about several microns, and then the liquid crystal is filled in the interval and sealed in the two sheets of glass substrates.

A method of filling and sealing the liquid crystal are carried out under vacuum. More particularly, the sealing member is coated on either of two glass substrates to be pasted and also the liquid crystal is dropped onto either of two glass substrates, and then two sheets of glass substrates are bonded together while applying a pressure, thereby sealing the liquid crystal.

In such manufacturing steps of the FPD, the chucking method based on a static electricity (the electrostatic chuck) has been used as the method of supporting the glass substrates under vacuum (at a low pressure).

For example, as a structure of the electrostatic chuck, such a structure has been proposed in which an insulating film is bonded to a substrate (base) made of metal material and also electrodes are provided to the substrate (see JP-A-2004-235563, for example).

However, when the large-sized glass substrate is chucked by the electrostatic chuck, in some cases, a warpage occurs in the substrate due to its own weight of the substrate. As a result, sometimes it is difficult to chuck the substrate using the electrostatic chuck with good precision.

For this reason, an elastomer layer for absorbing a stress caused by a deformation of the substrate is provided between a chucking portion including the electrode to which a voltage is applied, and the metal base on which the chucking portion is provided. At this time, an uneven pressing force caused by the warpage of the substrate can be absorbed by the elastomer layer, and thus it is possible to chuck the large-sized glass substrate with good precision.

However, when the elastomer layer is bonded to the metal base, in some cases, an air enters between the elastomer layer and the metal base, and a bubble is thus formed. In cases where such a bubble is formed and the electrostatic chuck is used at a low pressure, for example, the chucking surface bulges partially and thus a chucking force of the glass substrate is weakened and breakage of the glass substrate is brought about, and others. As a result, in some cases there is a problem that reliability of the electrostatic chuck is decreased.

SUMMARY OF THE INVENTION

Exemplary embodiments of the present invention provide an electrostatic chuck with high reliability of a chucking action and a method of manufacturing the electrostatic chuck with high reliability of the chucking action.

According to one or more aspects of the present invention, a method of manufacturing an electrostatic chuck, the method includes: providing an electrostatic chucking portion including an electrode to which a voltage is applied and a film-like insulating layer covering the electrode; bonding an elastomer layer onto the electrostatic chucking portion; bonding a metal base onto the elastomer layer such that recess portions formed on a surface of the metal base face the elastomer layer.

According to one or more aspects of the present invention, an electrostatic chuck includes: an electrostatic chucking portion comprising: an electrode to which a voltage is applied; and a film-like insulating layer covering the electrode, an elastomer layer bonded onto the electrostatic chucking portion; and a metal base bonded onto the elastomer layer, wherein recess portions are formed on a surface of the metal base that faces the elastomer layer.

According to the present invention, it is possible to provide the electrostatic chuck with high reliability of chucking action and the method of manufacturing the electrostatic chuck with high reliability of the chucking action.

Other aspects and advantages of the invention will be apparent from the following description, the drawings and the claims.

DETAILED DESCRIPTION

An exemplary embodiment of the present invention will be described with reference to the drawings hereinafter.

Figure 1:
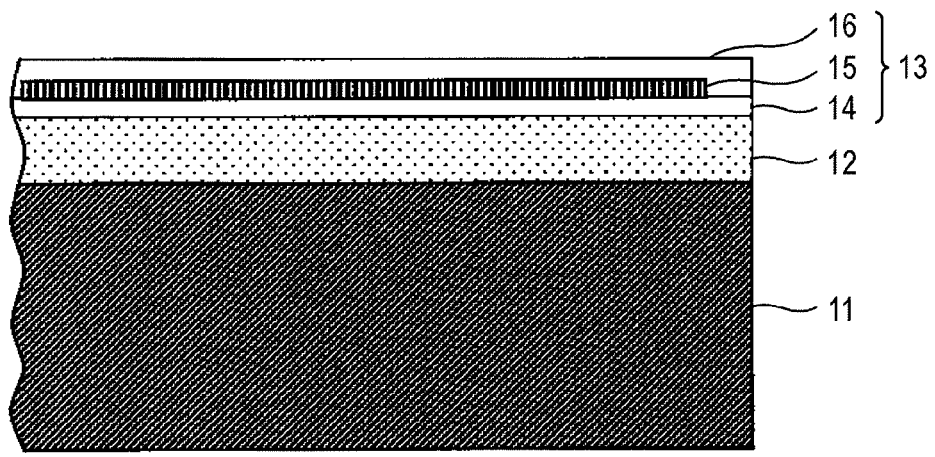
FIG. 1 is a schematic view of an electrostatic chuck in the related art.

FIG. 1 is a schematic view of an electrostatic chuck in the related art. By reference to FIG. 1, an electrostatic chuck 10 is constructed by bonding a chucking portion 13 to a metal base 11 via an elastomer layer 12. Also, illustration of adhesive layers used to connect respective layers is omitted herein.

Also, the chucking portion 13 has such a structure that an electrode 15 made of conductive material such as a metal is interposed between film-like insulating layers 14, 16 made of organic material and the overall electrode 15 is covered with the insulating layers 14, 16.

In the above structure, a chucked object such as the glass substrate held on the insulating layer 16 can be electrostatically chucked when a voltage is applied to the electrode 15. Also, the elastomer layer 12 is provided between the chucking portion 13 and the metal base 11. Therefore, uneven pressing pressure caused when the warpage is generated on the large-sized substrate can be absorbed by the elastomer layer 12, and thus the large-sized glass substrate can be chucked with good precision.

On the contrary, when the elastomer layer 12 is bonded to the metal base 11, in some cases, an air enters between the elastomer layer 12 and the metal base 11, and a bubble is thus formed. In cases where such a bubble is formed and the electrostatic chuck 10 is used at a low pressure, for example, the chucking surface bulges partially and thus a chucking force of the glass substrate is weakened and the glass substrate is broken, and others. As a result, in some cases, there is a problem that reliability of the electrostatic chuck is decreased.

Figure 2:
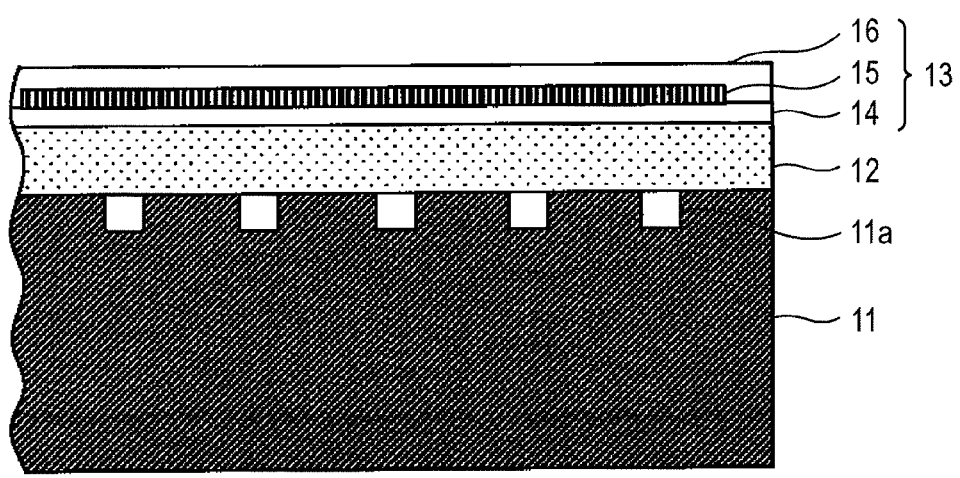
FIG. 2 is a schematic view of an electrostatic chuck according to the present invention.

Therefore, in an electrostatic chuck according to the present invention, recess portions for removing an air are formed on a surface of the metal base that faces the elastomer layer. FIG. 2 is a schematic view of an electrostatic chuck 10A as an example of the electrostatic chuck according to the present invention. In FIG. 2, the same reference symbols are affixed to the portions described above in FIG. 1, and their description will be omitted herein.

By reference to FIG. 2, the electrostatic chuck 10A of FIG. 2 is characterized in that a plurality of recess portions 11a are formed on a surface of the metal base 11 that faces to the elastomer layer 12. Since the recess portions 11a are formed, an air contained between the metal base 11 and the elastomer layer 12 can be easily removed when the elastomer layer 12 is bonded to the metal base 11. As a result, such advantages can be achieved that formation of the air between the metal base 11 and the elastomer layer 12 is suppressed, flatness of the chucking surface is held satisfactorily even when the electrostatic chuck 10 is used, e.g., at a low pressure, and reliability is improved when the glass substrate is chucked.

Figure 3:
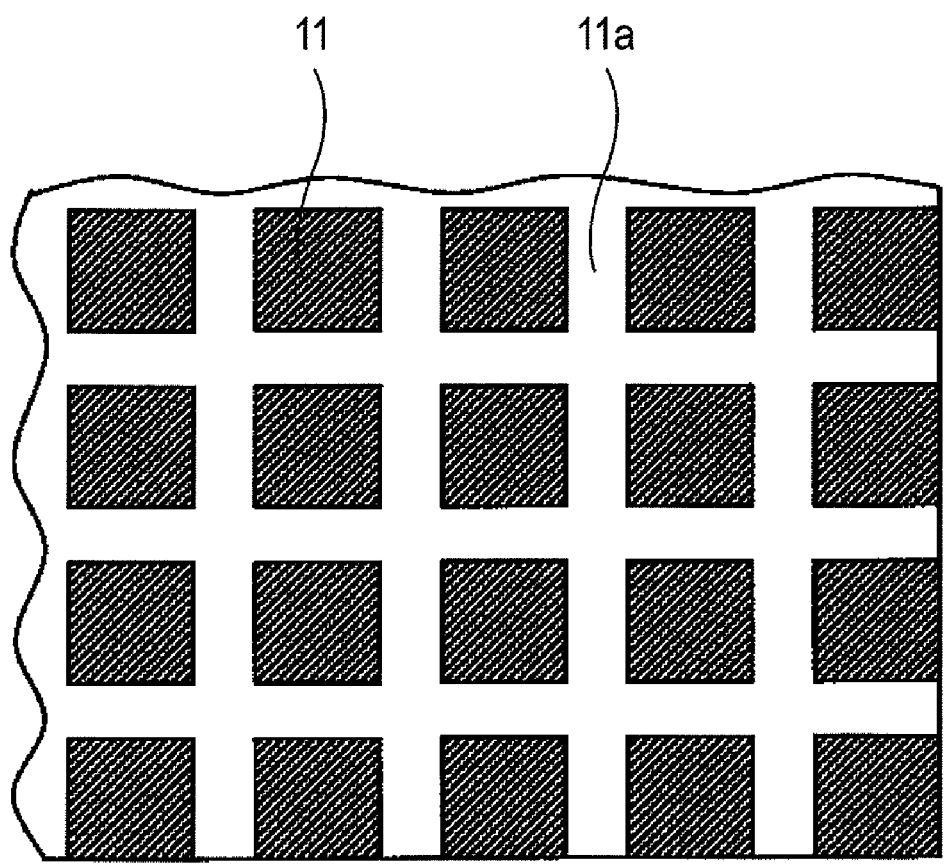
FIG. 3 is a plan view of a metal base of the electrostatic chuck in FIG. 2.

For example, the recess portions 11a are formed in grid-like fashion when the metal base 11 is viewed from the top. FIG. 3 is a plan view of the recess portions 11a (the metal base 11). It can be seen that the recess portions 11a are formed in grid-like fashion on the side that faces the elastomer layer 12. Also, the recess portions 11a are not limited to the grid-like pattern, and various patterns such as a radial pattern may be formed. Also, the recess portions may be formed on a surface of the elastomer layer 12 that faces the metal base 11.

Next, another particular example of the configuration of the above electrostatic chuck and a method of manufacturing the same will be described with reference to the drawings hereunder.

Embodiment 1

Figure 4:
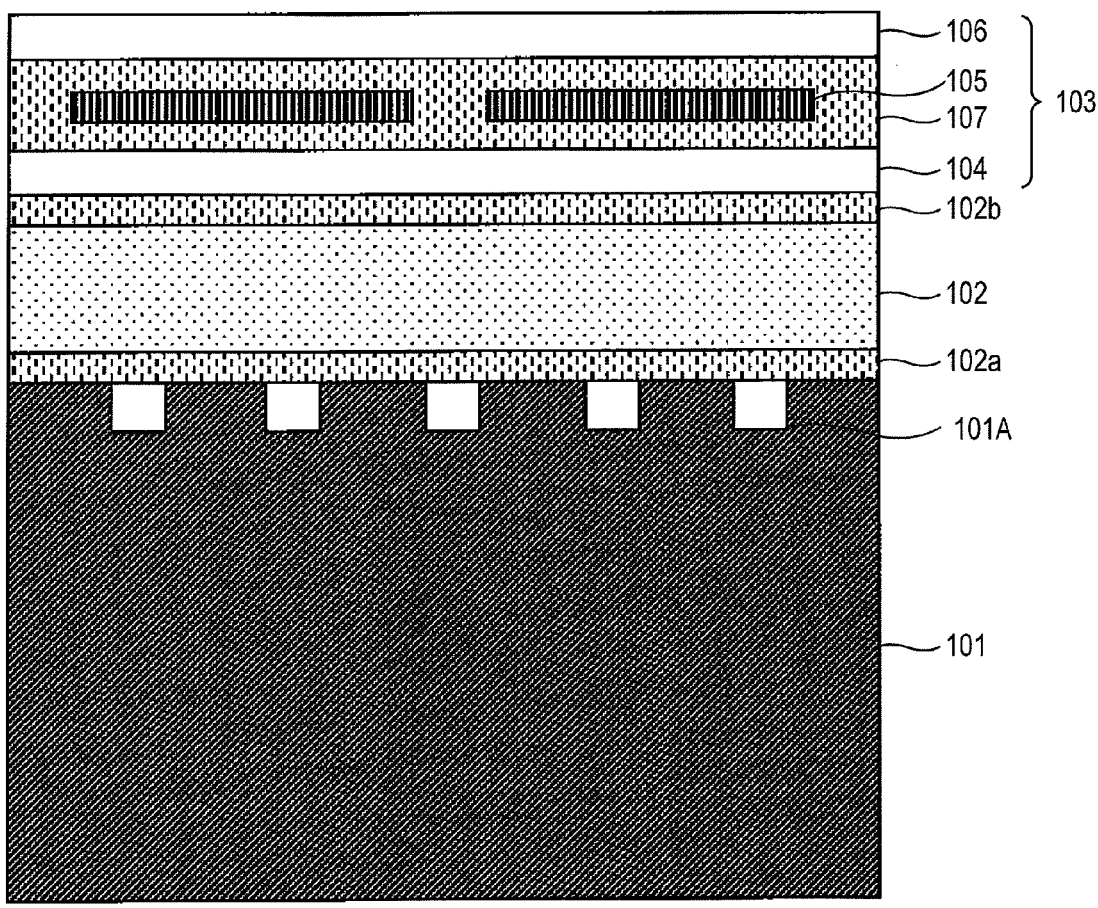
FIG. 4 is a schematic view of an electrostatic chuck according to Embodiment 1.

FIG. 4 is a sectional view showing schematically an electrostatic chuck 100 according to Embodiment 1 of the present invention. By reference to FIG. 4, the electrostatic chuck 100 according to the present embodiment is constructed such that a chucking portion 103 for chucking the chucked object is bonded to a metal base 101 made of a metal such as Al via an elastomer layer (cushion layer) 102 made of a silicone rubber, for example.

The chucking portion 103 has such a structure that electrodes 105 are interposed between a lower insulating layer 104 made of e.g., a polyimide film and an upper insulating layer 106 made of e.g., a polyester film, and are covered with them. The lower insulating layer 104 and the upper insulating layer 106 are bonded together by an adhesive layer 107. Also, the chucking portion 103 and the elastomer layer 102 are bonded together by an adhesive layer 102b, and the elastomer layer 102 and metal base 101 are bonded together by an adhesive layer 102a.

In the above electrostatic chuck 100, when the voltage of 500 V to 1000 V, for example, is applied to the electrodes 105 (illustration of the circuit, the connection path, etc. used to apply the voltage is omitted), the glass substrate put on the chucking portion 103 (the upper insulating layer 106) can be chucked and held thereon.

In the above electrostatic chuck 100, since the elastomer layer 102 is provided, uneven pressing pressure caused when the warpage is generated on the large-sized substrate can be absorbed, and thus the large-sized glass substrate can be chucked with good precision. Also, the above electrostatic chuck 100 is characterized in that a plurality of recess portions 101A are formed on a surface of the metal base 101 that faces the elastomer layer 102 (the adhesive layer 102a). Since the recess portions 101A are formed, an air contained between the metal base 101 and the elastomer layer 102 can be easily removed when the elastomer layer 102 is bonded to the metal base 101. As a result, such advantages can be achieved that formation of the air between the metal base 101 and the elastomer layer 102 is suppressed, flatness of the chucking surface is held satisfactorily even when the electrostatic chuck 100 is used e.g., at a low pressure, and reliability is improved when the glass substrate is chucked.

For example, the metal base 101 is not limited to Al, and may be formed of another metal material such as Cu, Cr, or the like. Also, the elastomer layer 102 is not limited to the silicone rubber, and any material may be used which has a predetermined elasticity to absorb a stress. For example, the elastomer layer 102 may be formed of a urethane rubber, a fluorine-containing rubber, or the like.

Also, the lower insulating layer 104 and the upper insulating layer 106 are formed of a film-like insulator (dielectric material) made of organic material, for example. The lower insulating layer 104 is formed of a polyimide film, for example, and the upper insulating layer 106 is formed of a polyester film, for example. In this case, these insulating layers are not limited to these materials, but the lower insulating layer 104 and the upper insulating layer 106 may be formed of various materials respectively. Also, the lower insulating layer 104 and the upper insulating layer 106 may be formed of the same material.

Also, the electrodes 105 are formed of a Cu foil, for example, but are not limited to this. The electrodes 105 may be formed of a metal foil made of Ni, Cr, Fe, Al, or the like. Also, the patterning process of the electrodes 105 is not limited to the process of patterning the metal foil by the etching, for example, and may be preformed by the film forming process (CVD, PVD, sputter, thermal spraying, or the like) using a mask.

Further, in view of a chucking force and a resistance voltage, it is preferable that the upper insulating layer 106 made of a polyester film should be formed to have a thickness of about 12 μm to 300 μm. In this case, a chucking force is enough to chuck the glass substrate by applying a voltage of about 500 V to 1000 V to the electrodes 105.

Also, in the recess portions 101A formed on the metal base 101, for example, a width of the recess may be set to 1 to 3 mm, a depth of the recess may be set to 1 to 3 mm, and an interval between adjacent recesses may be set to 20 to 50 mm. The above dimensions are given as an example, and respective dimensions are not limited to them.

Next, a method of manufacturing the above electrostatic chuck 100 will be described with reference to FIG. 5A to FIG. 5K hereunder. In the following Figures, the same reference symbols are affixed to the above-described portions and sometimes their description will be omitted herein.

Figure 5A:
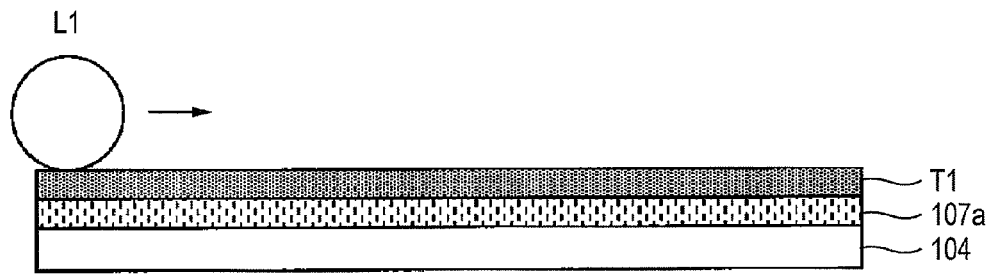
FIG. 5A is a view (#1) showing a method of manufacturing the electrostatic chuck according to Embodiment 1.

In step shown in FIG. 5A, an adhesive layer (an adhesive agent film) 107*a* with a peeling tape T1 is pushed against the lower insulating layer 104 made of a polyimide film by a roller laminator L1 and is bonded to the lower insulating layer 104. In this case, a temperature of the lower insulating layer 104 and the adhesive layer 107*a* is set to 70° C.

Figure 5B:
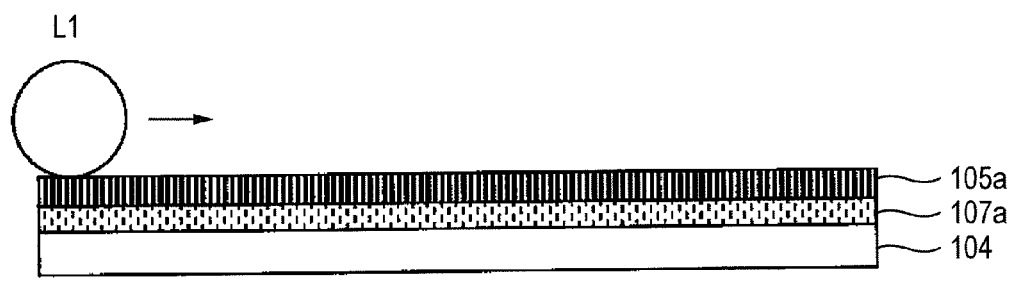
FIG. 5B is a view (#2) showing a method of manufacturing the electrostatic chuck according to Embodiment 1.

In step shown in FIG. 5B, the peeling tape T1 is peeled, and then a Cu foil 105*a* used as the electrodes 105 is pushed against the adhesive layer 107*a* by the roller laminator L1 and is bonded to the adhesive layer 107*a*. In this case, a temperature of the lower insulating layer 104, the adhesive layer 107*a*, and the Cu foil 105*a* is set to 70° C.

Figure 5C:
FIG. 5C is a view (#3) showing a method of manufacturing the electrostatic chuck according to Embodiment 1.

In step shown in FIG. 5C, the Cu foil 105*a* is patterned by the etching using a mask pattern (not shown), for example. Thus, the electrodes 105 are formed in a desired shape respectively. In this case, the adhesive layer 107*a* may also be patterned. Also, as described previously, the electrodes 105 may be formed by the film formation (CVD, PVD, sputter, deposition, or the like) using the mask pattern.

Figure 5D:
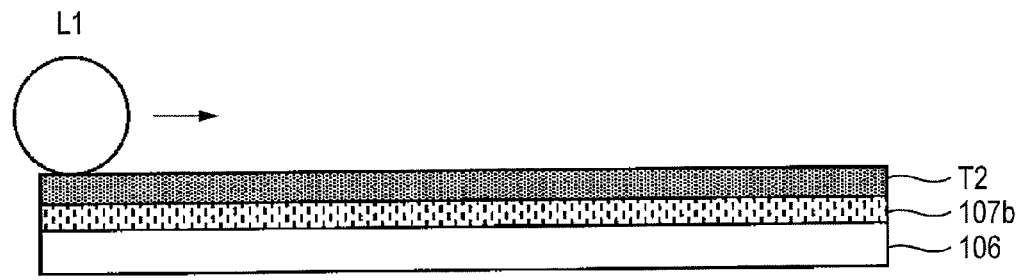
FIG. 5D is a view (#4) showing a method of manufacturing the electrostatic chuck according to Embodiment 1.

In step shown in FIG. 5D, an adhesive layer (an adhesive agent film) 107*b* with a peeling tape T2 is pushed against the upper insulating layer 106 made of a polyester film by the roller laminator L1 and is bonded to the upper insulating layer 106. In this case, a temperature of the upper insulating layer 106 and the adhesive layer 107*b* is set to 70° C. The peeling tape T2 is peeled after the adhesive layer 107*b* is bonded to and pushed against the upper insulating layer 106.

Figure 5E:
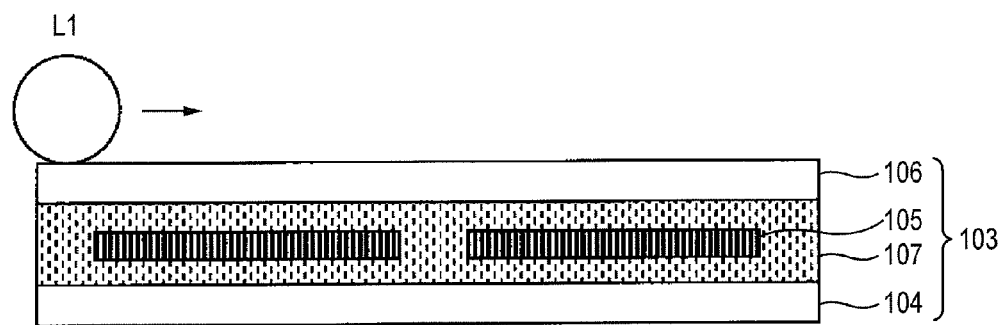
FIG. 5E is a view (#5) showing a method of manufacturing the electrostatic chuck according to Embodiment 1.

In step shown in FIG. 5E, the lower insulating layer 104, to which the electrodes 105 formed in step in FIG. 5C are bonded, and the upper insulating layer 106, onto which the adhesive layer 107*b* formed in step in FIG. 5D is bonded, are pushed by the roller laminator L1 and bonded together. In this case, the adhesive layer 107*a* and the adhesive layer 107*b* are integrated substantially to constitute the adhesive layer 107. Then, the chucking portion 103 including the electrodes 105 covered with the insulating layer (dielectric layers) 104, 106 is formed.

Figure 5F:
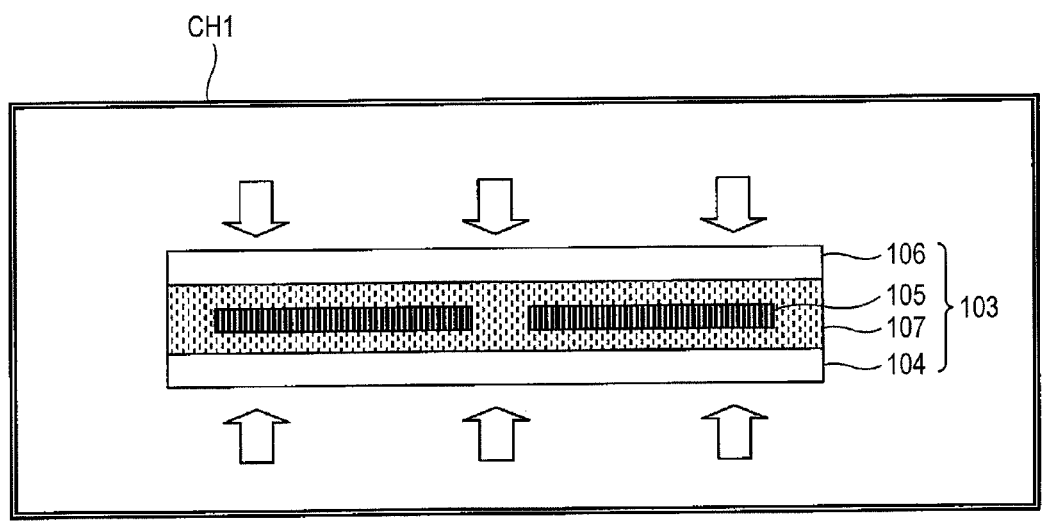
FIG. 5F is a view (#6) showing a method of manufacturing the electrostatic chuck according to Embodiment 1.

In step shown in FIG. 5F, the chucking portion 103 may be held in a low-pressure vessel CH1, and then an adhesive force between the lower insulating layer 104 and the upper insulating layer 106 may be enhanced by pressing the lower insulating layer 104 and the upper insulating layer 106 at a low pressure.

Figure 5G:
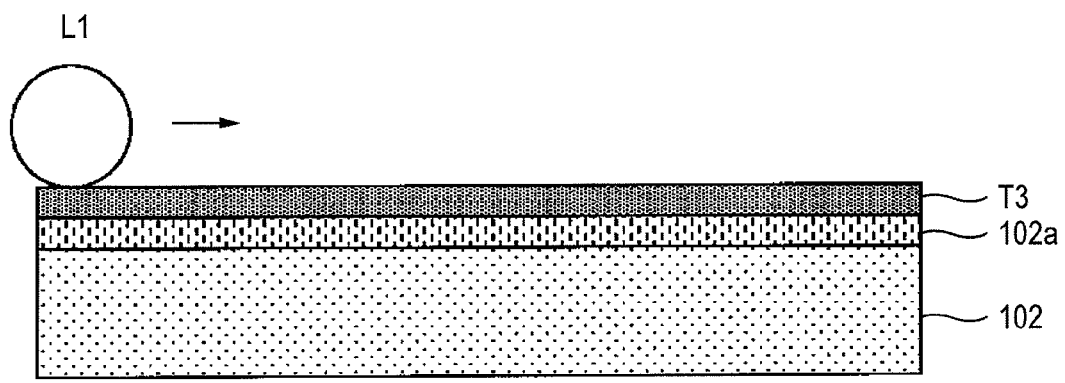
FIG. 5G is a view (#7) showing a method of manufacturing the electrostatic chuck according to Embodiment 1.

In step shown in FIG. 5G, the adhesive layer (adhesive agent film) 102*a* with a peeling tape T3 is pushed against the elastomer layer 102 made of a silicone rubber by the roller laminator L1 and is bonded to the elastomer layer 102. In this case, a temperature of the elastomer layer 102 and the adhesive layer 102*a* is set to 70° C.

Figure 5H:
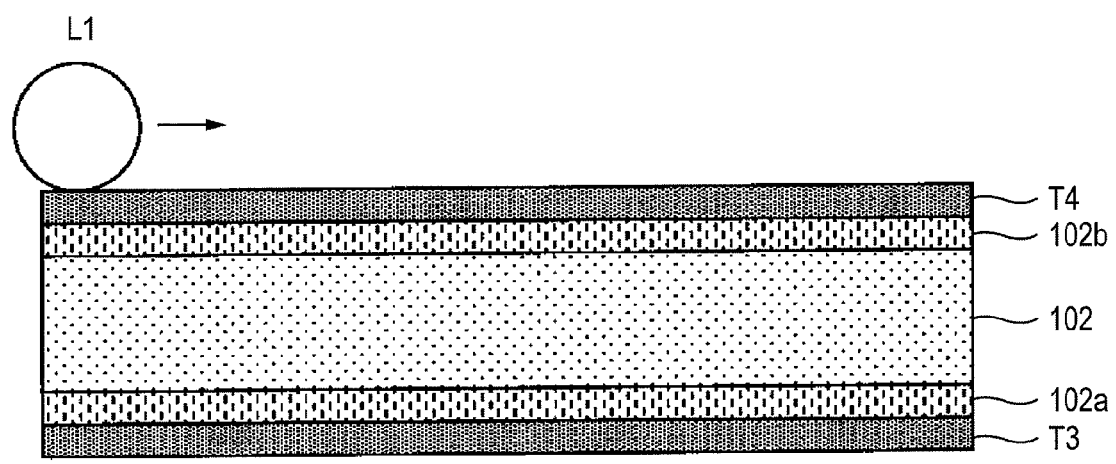
FIG. 5H is a view (#8) showing a method of manufacturing the electrostatic chuck according to Embodiment 1.

In steps shown in FIG. 5H, like the step in FIG. 5G, the adhesive layer (adhesive agent film) 102*b* with a peeling tape T4 is pushed against a surface of the elastomer layer 102 opposite to the surface onto which the adhesive layer 102*a* is bonded, by the roller laminator L1 and is bonded to the elastomer layer 102. In this case, a temperature of the elastomer layer 102 and the adhesive layer 102*b* is set to 70° C. As a result, the adhesive layers 102*a*, 102*b* are bonded on both surfaces of the elastomer layer 102 respectively.

Figure 5I:
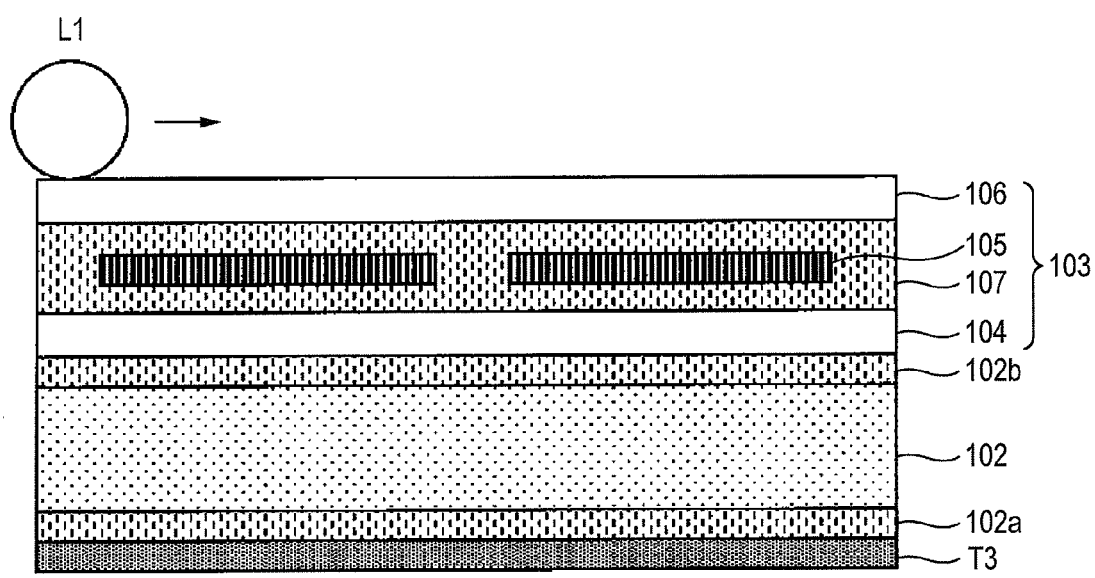
FIG. 5I is a view (#9) showing a method of manufacturing the electrostatic chuck according to Embodiment 1.

In steps shown in FIG. 5I, the peeling tape T4 on the adhesive layer 102*b* is peeled. Then, the chucking portion 103 is bonded onto the elastomer layer 102 via the adhesive layer 102*b* and then pushed by the roller laminator L1. As a result, the chucking portion 103 and the elastomer layer 102 are bonded together with the adhesive layer 102*b* interposed therebetween.

Figure 5J:
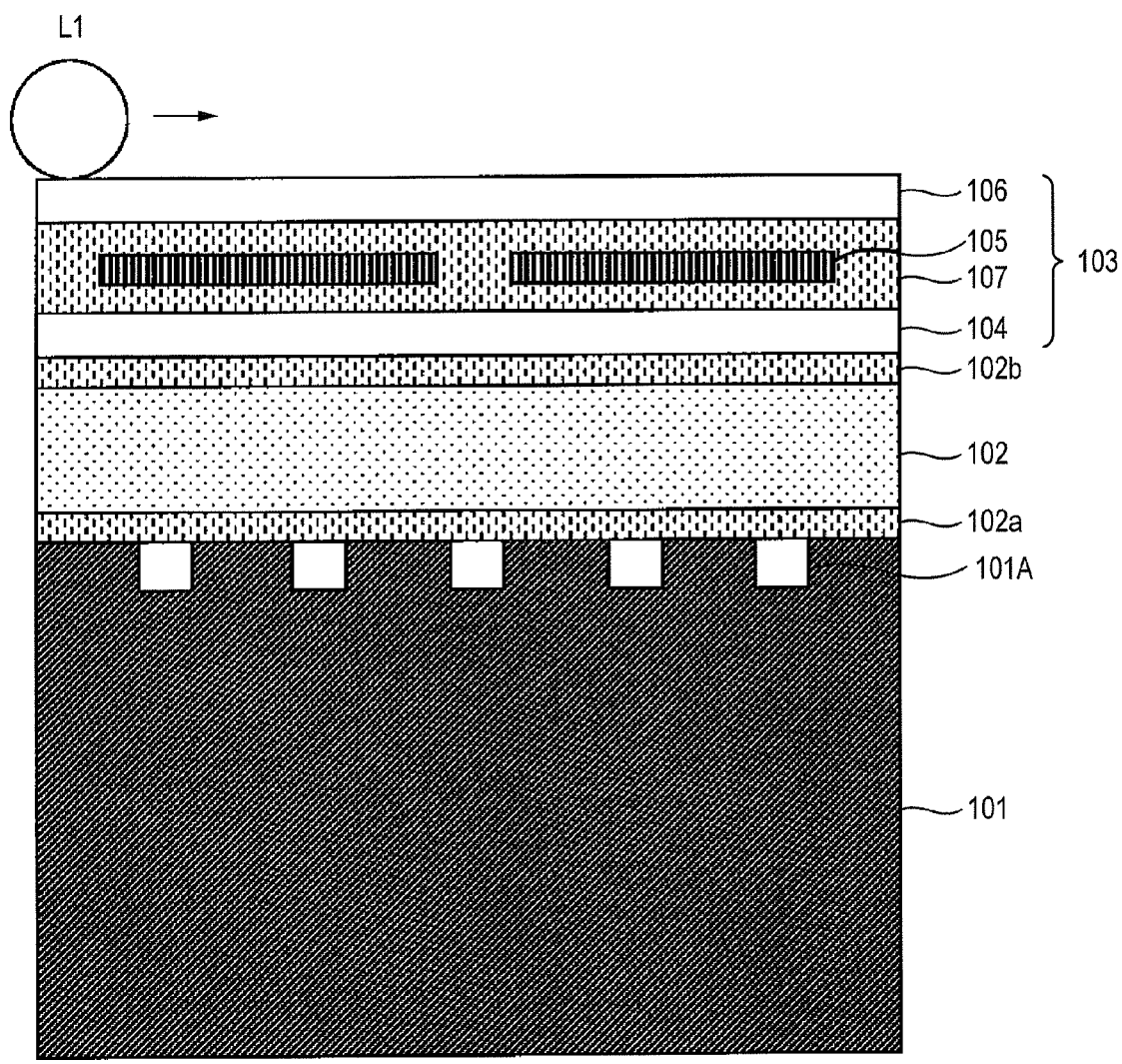
FIG. 5J is a view (#10) showing a method of manufacturing the electrostatic chuck according to Embodiment 1.

In steps shown in FIG. 5J, the peeling tape T3 is peeled. Then, the elastomer layer 102 onto which the chucking portion 103 is bonded is bonded onto the surface of the metal base 101, on which the recess portions 101A are formed, via the adhesive layer 102*a*, and then pushed by the roller laminator L1. As a result, the elastomer layer 102 onto which the chucking portion 103 is bonded and the metal base 101 are bonded together with the adhesive layer 102*a* interposed therebetween. In this case, since the recess portions 101A are formed on the metal base 101 in grid-like fashion, for example, it can be suppressed effectively that the bubble is formed between the metal base 101 and the elastomer layer 102. In this manner, the electrostatic chuck 100 shown in FIG. 4 can be formed.

Figure 5K:
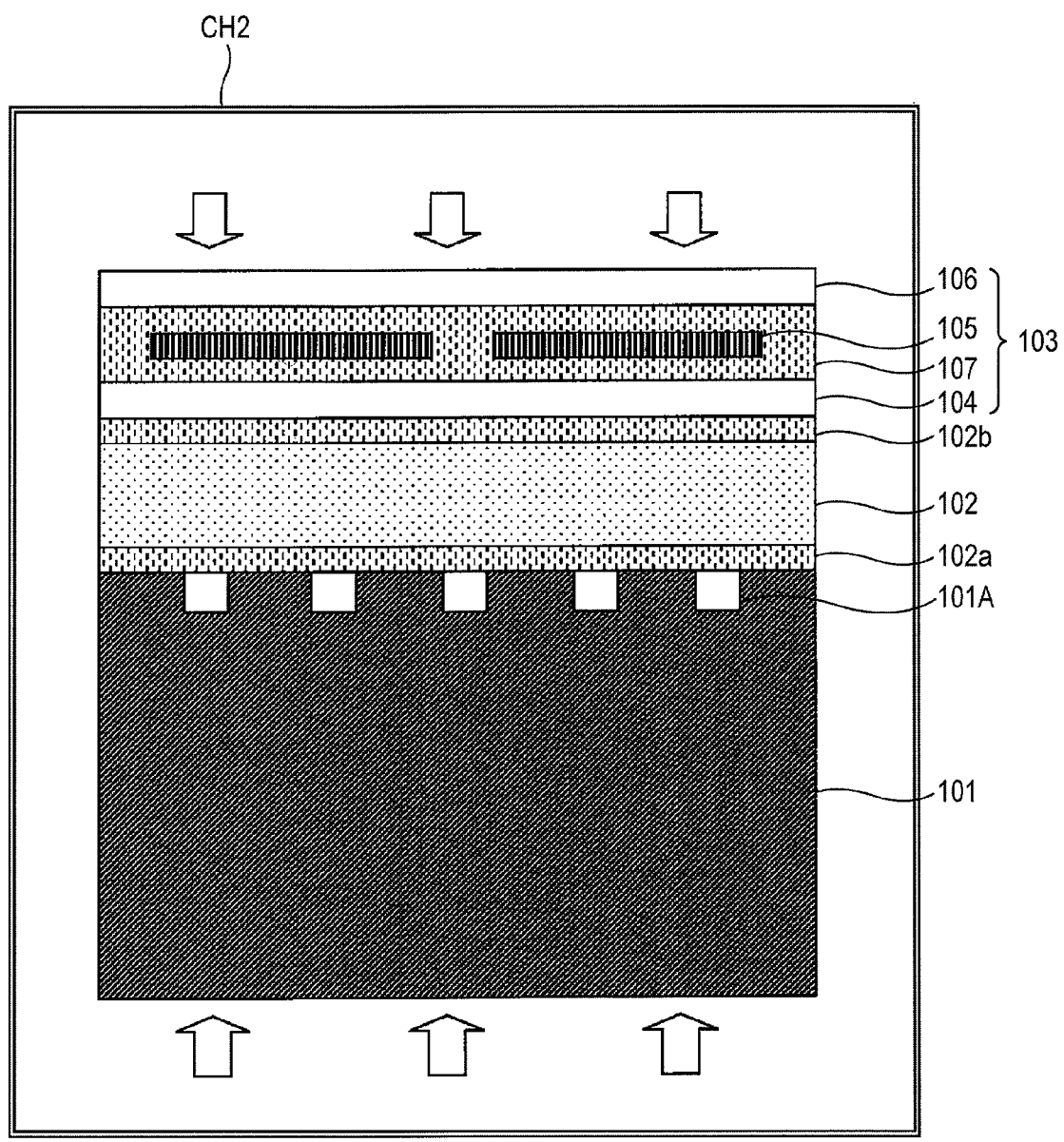
FIG. 5K is a view (#11) showing a method of manufacturing the electrostatic chuck according to Embodiment 1.

Further, in steps shown in FIG. 5K, the electrostatic chuck 100 may be held in a low-pressure vessel CH2, and then an adhesive force between the elastomer layer 102 and the metal base 101 may be enhanced by pressing the elastomer layer 102 and the metal base 101 at a low pressure.

Next, in both the electrostatic chuck manufactured by the above embodiment and the electrostatic chuck manufactured by the related art method (the method by which no recess portion is formed on the metal base), the results of the defect caused by the bulge of the chucking surface at a low pressure will be described hereunder.

TABLE 1

| | Electrostatic chuck having recesses of the present invention | Electrostatic chuck of the related art |
|---|---|---|
| Number of prepared chuck | 52 | 20 |
| No surface bulge (Non-defective) | 52 | 5 |
| Surface bulge (Defective) | 0 | 15 |

As shown in Table 1, in the electrostatic chuck manufactured by the related art method, the defect caused by the bulge of the chucking surface occurred in 15 unit among 20 manufactured units. In contrast, in the electrostatic chuck manufactured by the present embodiment, the defect occurred in 0 unit among 52 manufactured units. In this manner, it was confirmed that reliability of the chucking action of the electrostatic chuck according to the present embodiment can be improved.

According to the present invention, it is possible to provide the electrostatic chuck with high reliability of chucking action and the method of manufacturing the same.

While the present invention has been shown and described with reference to certain exemplary embodiments thereof, it will be understood by those skilled in the art that various changes in form and details may be made therein without departing from the spirit and scope of the invention as defined by the appended claims. It is aimed, therefore, to cover in the appended claim all such changes and modifications as fall within the true spirit and scope of the present invention.

What is claimed is:

1. A method of manufacturing an electrostatic chuck, the method comprising:
   providing an electrostatic chucking portion including an electrode to which a voltage is applied and a film-like insulating layer covering the electrode;
   bonding a planar elastomer layer onto the electrostatic chucking portion;
   forming recess portions on a surface of a metal base
   bonding the metal base onto the planar elastomer layer such that the recess portions formed on the surface of the metal base face the planar elastomer layer and such that the planar elastomer layer avoids entering the recess portions; and
   removing air between the metal base and the planar elastomer layer through the recess portions.

2. The method of claim 1, wherein the recess portions are formed in grid-like fashion.

3. The method of claim 1, further comprising:
   pushing the planar elastomer layer against the metal base by a roller laminator.

4. The method of claim 3, further comprising:
   pushing the planar elastomer layer against the metal base under a low-pressure environment.

5. An electrostatic chuck, comprising:
   an electrostatic chuck portion comprising:
      an electrode to which a voltage is applied; and
      a film-like insulating layer covering the electrode,
   a planar elastomer layer bonded onto the electrostatic chucking portion; and
   a metal base bonded onto the planar elastomer layer,
   wherein recess portions between the metal base and the planar elastomer layer are formed on a surface of the metal base that faces the planar elastomer layer and the planar elastomer layer avoids entering the recess portions.

6. The electrostatic chuck of claim 5, wherein the recess portions are formed in grid-like fashion.

7. The method of claim 3, wherein the planar elastomer layer has a predetermined elasticity to absorb a stress.

8. The method of claim 3, further comprising:
   forming the planar elastomer layer from at least one of a silicone rubber, a urethane rubber, and a fluorine-containing rubber.

9. The electrostatic chuck of claim 5, wherein the planar elastomer layer has a predetermined elasticity to absorb a stress.

10. The electrostatic chuck of claim 5, wherein the planar elastomer layer is formed of at least one of a silicone rubber, a urethane rubber, and a fluorine-containing rubber.

* * * * *